(12) United States Patent
Kappes et al.

(10) Patent No.: US 9,979,582 B1
(45) Date of Patent: May 22, 2018

(54) MULTI-ZONE ANALOG-TO-DIGITAL CONVERTER (ADC)

(71) Applicant: IQ-Analog Corporation, San Diego, CA (US)

(72) Inventors: Michael Kappes, San Diego, CA (US); Steven R. Norsworthy, Cardiff, CA (US)

(73) Assignee: IQ-Analog Corp., San Diego, CA (US)

( * ) Notice: Subject to any disclaimer, the term of this patent is extended or adjusted under 35 U.S.C. 154(b) by 0 days. days.

(21) Appl. No.: 15/673,228

(22) Filed: Aug. 9, 2017

Related U.S. Application Data (60) Provisional application No. 62/530,567, filed on Jul. 10, 2017.

(51) Int. Cl.

| | | |
|---|---|---|
| *H03M 1/00* | (2006.01) | |
| *H04L 27/26* | (2006.01) | |
| *H03M 3/00* | (2006.01) | |
| *H04L 27/20* | (2006.01) | |
| *H04L 5/00* | (2006.01) | |
| *H04B 1/04* | (2006.01) | |
| *H04L 27/00* | (2006.01) | |

(52) U.S. Cl.
CPC ........ *H04L 27/2666* (2013.01); *H03M 3/496* (2013.01); *H04L 5/0008* (2013.01); *H04L 27/2092* (2013.01); *H04B 2001/0491* (2013.01); *H04L 2027/0081* (2013.01)

(58) Field of Classification Search
CPC .. H03M 3/496; H04L 5/0008; H04L 27/2092; H04L 27/2666
USPC .................................................. 341/126–155
See application file for complete search history.

(56) References Cited

U.S. PATENT DOCUMENTS

| | | | |
|---|---|---|---|
| 6,259,281 B1 | 7/2001 | Neff | |
| 6,717,998 B2* | 4/2004 | Adachi | ........... H03L 7/1976 331/25 |
| 7,015,729 B1 | 3/2006 | Tursi et al. | |
| 7,015,842 B1 | 3/2006 | Gupta et al. | |
| 7,248,082 B2 | 7/2007 | Naskasha et al. | |
| 7,339,984 B1* | 3/2008 | Daou | ............... H03L 7/18 375/225 |
| 7,352,309 B2 | 8/2008 | Draxelmayr | |
| 7,782,096 B2 | 8/2010 | Corsi et al. | |
| 7,834,786 B2 | 11/2010 | Kawahito et al. | |
| 8,081,013 B1* | 12/2011 | Zhang | ............. G01R 25/08 324/76.77 |
| 8,217,824 B2 | 7/2012 | Hernes et al. | |

(Continued)

*Primary Examiner* — Lam T Mai
(74) *Attorney, Agent, or Firm* — Law Office of Gerald Maliszewski; Gerald Maliszewski (57) ABSTRACT

A multi-zone analog-to-digital converter (ADC) is provided that includes a track-and-hold (T/H) stage having a bandwidth of L Hertz (Hz) to accept an analog input signal, a clock input to accept a clock signal with a clock frequency of P Hz, and N deinterleaved signal outputs with a combined bandwidth of M Hz. N×(P/2)=M, L>Q×M, and Q is an integer >1. The T/H stage is able to sample an analog input signal in the Qth Nyquist Zone, where Q is an integer. A quantizer stage has N interleaved signal inputs connected to corresponding T/H stage signal outputs, a clock input to accept the clock signal, and an output to supply a digital output signal having a bandwidth of M Hz. A packaging interface typically connects the T/H stage to the quantizer stage, and has a bandwidth less than the clock frequency.

26 Claims, 10 Drawing Sheets

(56) References Cited

U.S. PATENT DOCUMENTS

| | | |
|---|---|---|
| 8,493,099 B2 | 7/2013 | Noguchi |
| 8,581,636 B2 | 11/2013 | Mateman |
| 8,718,210 B2 | 5/2014 | Motamed et al. |
| 8,742,797 B2 | 6/2014 | Hoskins |
| 8,786,475 B2 | 7/2014 | Hernes |
| 9,209,844 B2 | 12/2015 | Han et al. |
| 9,641,204 B2 | 5/2017 | Ghannouchi et al. |
| 2003/0072397 A1* | 4/2003 | Kim .................... H04B 7/0848 375/347 |
| 2008/0218257 A1 | 9/2008 | Lee |
| 2015/0009053 A1 | 1/2015 | Hernes |
| 2017/0149439 A1* | 5/2017 | Ling .................... H03M 1/002 |

* cited by examiner

MULTI-ZONE ANALOG-TO-DIGITAL CONVERTER (ADC)

RELATED APPLICATIONS

This application claims the benefit of a Provisional application entitled, SUBSAMPLING ANALOG-TO-DIGITAL CONVERTER (ADC), invented by Mike Kappes et al., Ser. No. 62/530,567, filed Jul. 10, 2017, which is incorporated herein by reference.

The following applications are also incorporated herein by reference:

N-PATH INTERLEAVING ANALOG-TO-DIGITAL CONVERTER (ADC) WITH BACKGROUND CALIBRATION, invented by Mikko Waltari, Ser. No. 14/531,371, filed Nov. 3, 2014, now U.S. Pat. No. 9,030,340;

INTERLEAVING ANALOG-TO-DIGITAL CONVERTER (ADC) WITH BACKGROUND CALIBRATION, invented by Mikko Waltari et al., Ser. No. 14/511,206, filed Oct. 10, 2014, now U.S. Pat. No. 8,917,125;

TIME-INTERLEAVED ANALOG-TO-DIGITAL CONVERTER FOR SIGNALS IN ANY NYQUIST ZONE, invented by Mikko Waltari, Ser. No. 13/603,495, filed Sep. 5, 2012, issued as U.S. Pat. No. 8,654,000 on Feb. 18, 2014; and, CURRENT IMPULSE (CI) DIGITAL-TO-ANALOG CONVERTER (DAC), invented by Mikko Waltari, Ser. No. 14/750,203, filed Jun. 25, 2015, issued as U.S. Pat. No. 9,178,528 on Nov. 3, 2015.

BACKGROUND OF THE INVENTION

1. Field of the Invention

This invention generally relates to analog-to-digital converters (ADCs) and, more particularly, to a system and method for efficiently sampling analog signals in higher order Nyquist zones.

2. Description of the Related Art

Figure 1:
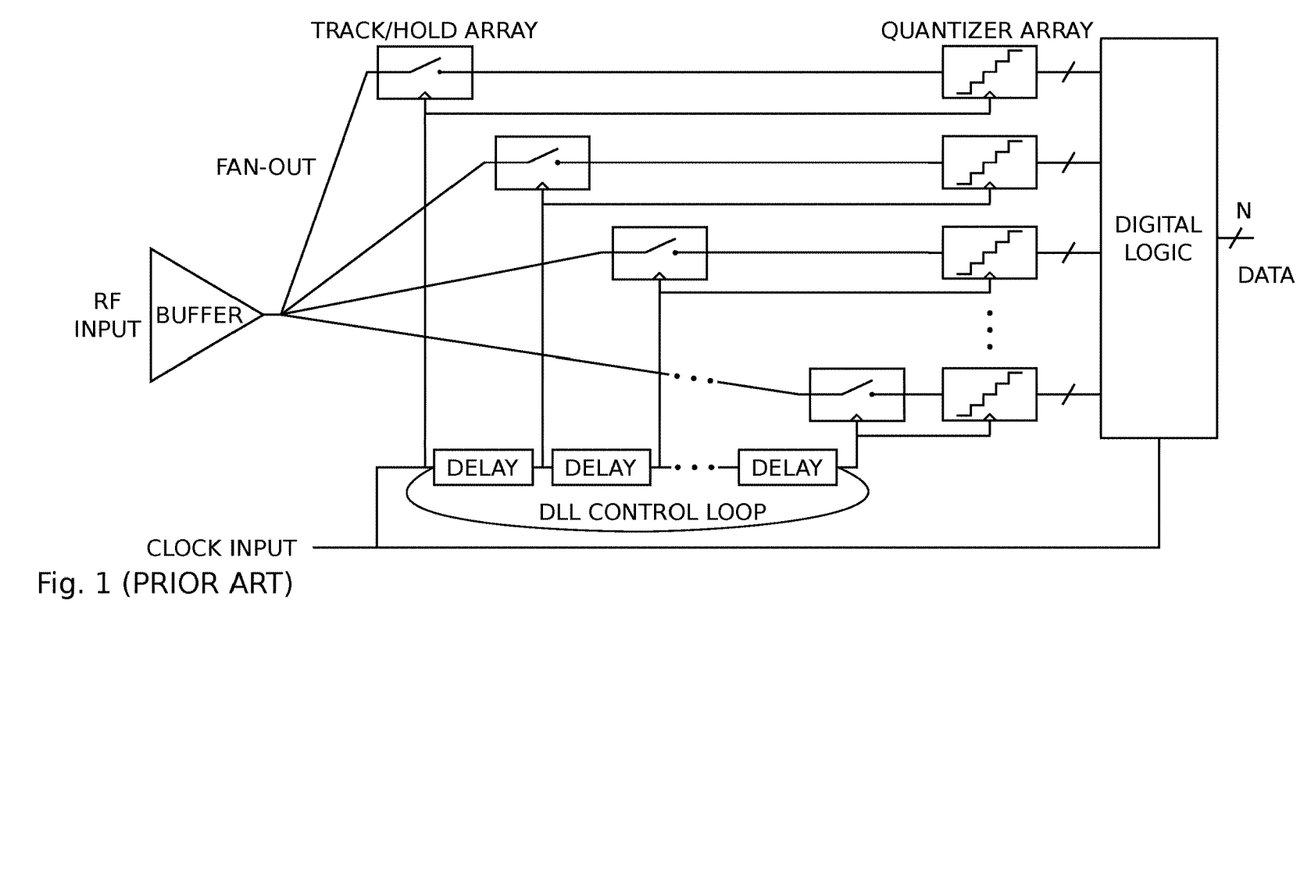
FIG. 1 is a schematic block diagram of an interleaved converter (prior art).

FIG. 1 is a schematic block diagram of an interleaved converter (prior art). Interleaved converters are used to achieve high quantizer sample rates by using multiple converters in parallel with controlled clock phases. Sampling is the reduction of a continuous-time (analog) signal into a discrete-time signal, with a sample being a value or set of values at a point in time. That is, the amplitude of the analog signal is measured at each phase of the clock. Once quantized, the samples can be converted into digital values and interleaved using controlled clock phases to create a digital word. In this example, since the sampling is performed at each of four clock phases, the sampling rate is four times the clock frequency.

The Nyquist frequency is half of the sampling rate ($f_S$) of a discrete signal processing system, and the Nyquist rate is the minimum sampling rate that satisfies the Nyquist sampling criterion for a given signal. The Nyquist rate is twice the maximum component frequency of the function being sampled. Undersampling or subsampling of the signal results in aliasing. Aliasing produces copies of the Fourier transform of the sampled signal that are shifted by multiples of the sampling rate and combined. If the Nyquist criterion is not satisfied, adjacent copies of the signal overlap. One means of digitally reconstructing interleaved analog signals sampled in higher Nyquist zones is demonstrated in U.S. Pat. No. 8,654,000 (Waltari), which is incorporated herein by reference.

Figure 2:
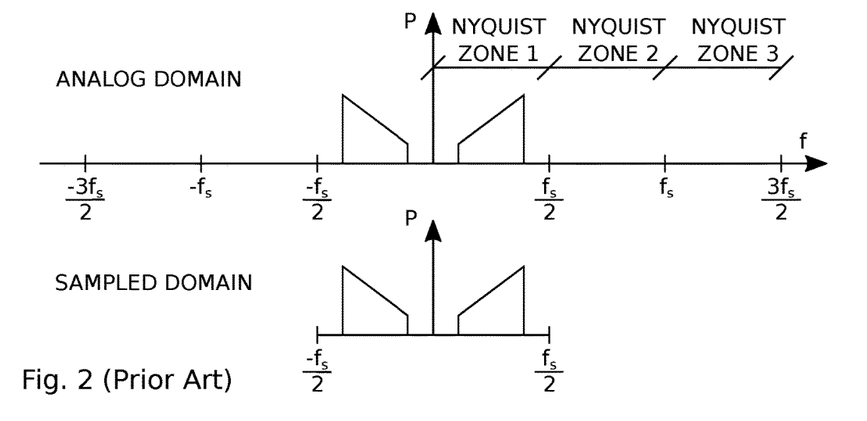
FIGS. 2 through 4 depict the spectrum an ADC input signal in the analog domain and the spectrum of the corresponding ADC output signal in the sampled domain (prior art).
Figure 3:
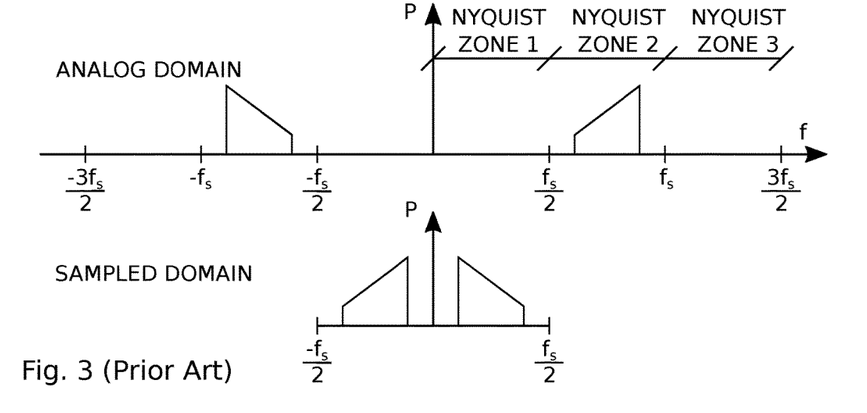
Figure 4:
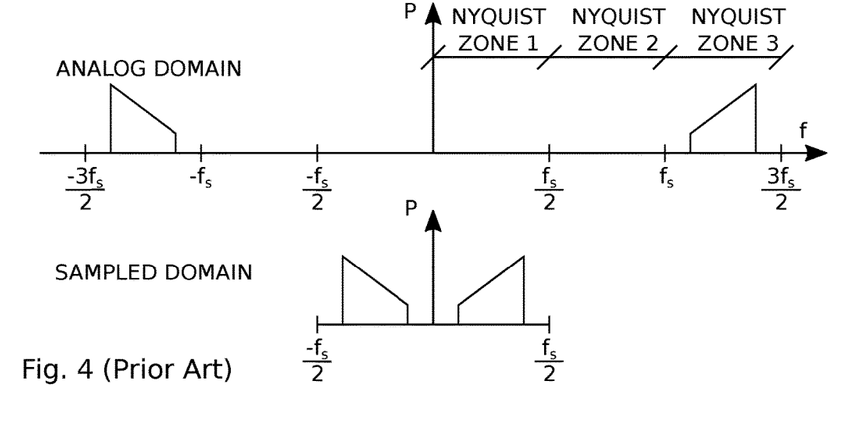

FIGS. 2 through 4 depict the spectrum an ADC input signal in the analog domain and the spectrum of the corresponding ADC output signal in the sampled domain (prior art). In the sampled domain, signals only up to fS/2 can be uniquely represented. For instance, two signals at different frequencies f and $f_S$+f in the continuous time domain (ADC input) both appear at the same frequency fin the sampled domain. It can be seen that the input signal in the range from 0 to $f_S/2$ (FIG. 2) results in an output signal that is identical to one produced by an input signal in the range from $f_S$ to $3f_S/2$ (FIG. 4). An input signal in the range from $f_S/2$ to $f_S$ (FIG. 3) undergoes the same down conversion process, but with additional spectral inversion.

Figure 5A:
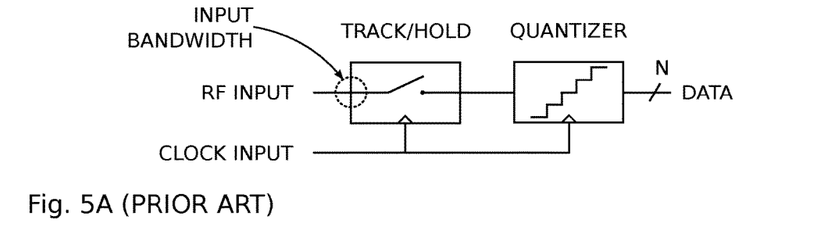
FIGS. 5A and 5B are schematic diagrams depicting the input bandwidth of CMOS circuitry (prior art).
Figure 5B:
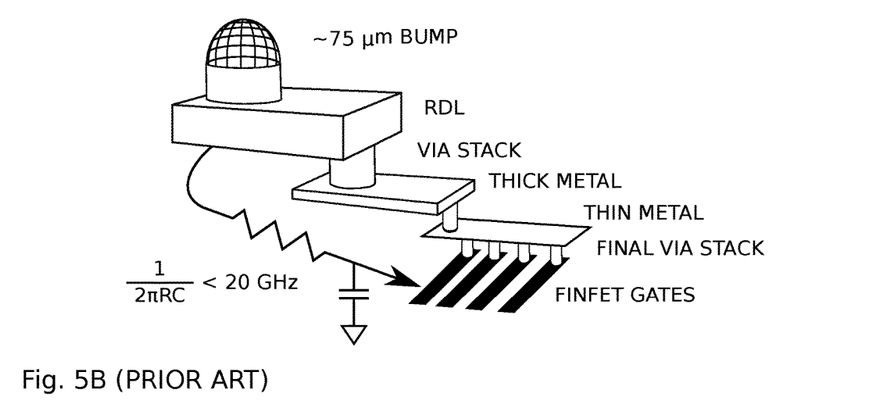

FIGS. 5A and 5B are schematic diagrams depicting the input bandwidth of CMOS circuitry (prior art). At the time of this writing, 14 nanometer (nm) CMOS is that state of the art, and the routing metals are optimized for dense co-located digital gates. The gate density will only increase as CMOS fabrication processes evolve. High current analog signals see a finite RC-limited bandwidth in traversing from the integrated circuit (IC) external package interface (bump), through the extra thick redistribution layer (RDL), to the thin metal vias connecting the FinFet transistor gates, making the effective input bandwidth limited to less than 20 gigahertz (GHz), barring inductive bandpass coupling. Thus, even if sampled at a rate high enough to satisfy the Nyquist criteria, the use of conventional CMOS circuitry limits a CMOS ADC to frequencies of less than 20 GHz.

Potential solutions to this problem are the addition of input buffers between the IC package interface and the FinFet transistors. However, the use of buffers would contribute noise, distortion, and significant power usage, while only pushing the problem to the input of the buffer. Another solution is to use better (e.g., thicker) metal routing. However, the problem would remain in the via stack used to transition between IC interlevels to access the gates. The via stack is comprised of "thin metals" layer interconnections that are adequate only for digital routing. Since a large percentage of the ADC functions are performed in the digital domain, it would be impractical to design an IC with via thicknesses sufficient to support high frequency analog signals. Further, economics dictate that these thin metal vias will continue to get thinner to support higher density logic.

Another potential solution is to offload the sampling to a better suited technology. For example, IBM's 9HP process uses thick metals and silicon/germanium (SiGe) transistors with a high frequency cutoff frequency of greater than 400 GHz. However, using thicker metals and SiGe transistors to enable collocated logic circuitry would make for large, power demanding ICs at an impractical size and price.

It would be advantageous if an ADC could be fabricated with SiGe transistors for the processing of high frequency analog signals, in combination with CMOS logic circuits, to reduce circuit size, power consumption, and cost.

SUMMARY OF THE INVENTION

Disclosed herein are a multi-zone analog-to-digital converter (ADC) system and method. The system uses a track-and-hold (T/H) stage fabricated in a high frequency (e.g., IBM 9HP) technology, in combination with quantizers and logic circuitry fabricated in a lower frequency capable (e.g., CMOS) technology. The two technologies, fabricated on different dies, are heterogeneously integrated, for example using Diverse Accessible Heterogeneous Integration (DAHI) level packaging.

Accordingly, the multi-zone ADC includes a T/H stage with a signal input having a bandwidth of L Hertz (Hz) to accept an analog input signal, a clock input to accept a clock signal with a clock frequency of P Hz, and N deinterleaved signal outputs with a combined bandwidth of M Hz. N×(P/2)=M, L>Q×M, and Q is an integer greater than 1. Thus, the T/H stage is able to sample an analog input signal in the Qth Nyquist Zone. A quantizer stage has N interleaved signal inputs connected to corresponding T/H stage signal outputs, a clock input to accept the clock signal, and an output to supply a digital output signal having a bandwidth of M Hz. Typically, a packaging interface connects the T/H stage signal outputs to the quantizer stage signal inputs. Each packaging interface has a (RC-limited) bandwidth less than the clock frequency.

Typically, the T/H stage is fabricated with transistors (e.g., silicon/germanium (SiGe)) having a cutoff frequency of greater than L Hz, while the quantizer stage is fabricated with transistors (e.g., CMOS) having a cutoff frequency greater than M Hz and less than L Hz.

More explicitly, the T/H stage is made up of a polyphase sampler or deinterleaver having a signal input to accept the analog input signal, a phase input to accept N phases of the clock signal, and outputs to supply N sampled signals. Each sampled signal is sampled at a corresponding clock signal phase. A delay-locked loop has an input to accept the clock signal, and an output to supply the N phases of the clock frequency. The T/H stage includes N output buffers. Each output buffer has an input to accept a corresponding sampled signal and an output to supply a corresponding deinterleaved signal output.

The quantizer stage also includes a delay-locked loop having an input to accept the clock signal and an output to supply N phases of the clock frequency. The quantizer stage includes N truncation circuits. Each truncation circuit has a signal input to accept a corresponding T/H stage deinterleaved signal output, a phase input to accept a corresponding clock signal phase, and a signal output to supply a corresponding digital value. An interleaver has a signal input to accept the N digital values from the truncation circuits, a clock input to accept the clock signal, and an output to supply the digital output.

Additional details of the above-described multi-zone ADC, a receiver made using the multi-zone ADC, a multi-zone analog-to-digital conversion method, and a multi-zone transceiver are provided below.

DETAILED DESCRIPTION

Figure 6:
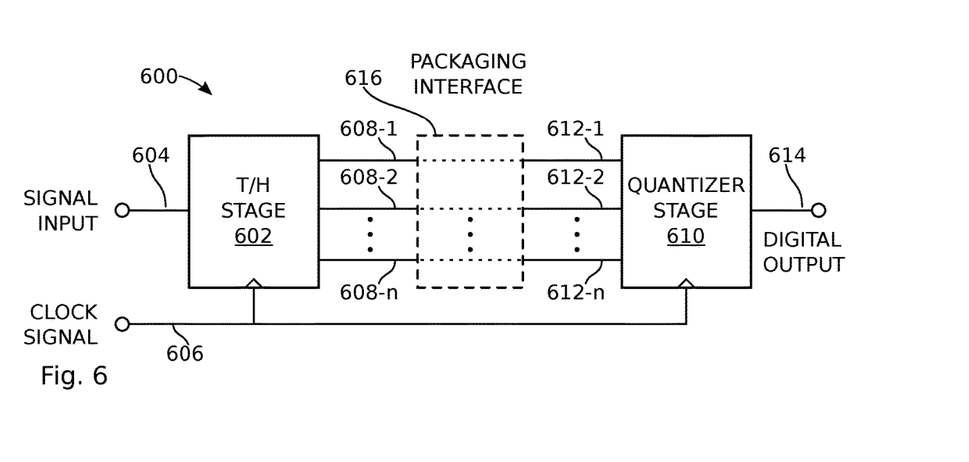
FIG. 6 is a schematic block diagram of an exemplary multi-zone analog-to-digital converter (ADC).

FIG. 6 is a schematic block diagram of an exemplary multi-zone analog-to-digital converter (ADC). The ADC 600 comprises a track-and-hold (T/H) stage 602 having a signal input on line 604 with a bandwidth of L Hertz (Hz) to accept an analog input signal. That is, the device is capable of recovering signals with a bandwidth defined between 0 and L Hz. As such, L may be termed as a device bandwidth as essential active devices in the T/H stage 602 have the ability to operate at a bandwidth of L Hz, regardless of the bandwidth of the actual analog input signals. The T/H stage 602 also includes a clock input on line 606 to accept a clock signal with a clock frequency of P Hz, and N deinterleaved signal outputs on lines 608-1 through 608-n with a combined bandwidth of M Hz. That is, the deinterleaved signal outputs supply a combined signal in the bandwidth between 0 and M Hz. N×(P/2)=M, L>Q×M, and Q is an integer greater than 1. The system is not limited to any particular integer value of N. However, it should be noted that the T/H stage also performs as described above when L is greater than M, but less than 2M (e.g., Q is equal to 1). A quantizer stage 610 has N interleaved signal inputs on lines 612-1 through 612-n operatively connected to corresponding T/H stage signal outputs on lines 608-1 through 608-n. As used herein, "operatively connected" means either directly connected or indirectly connected through an intervening medium. The quantizer stage 610 has a clock input to accept the clock signal on line 606 and an output on line 614 to supply a digital output signal having a bandwidth of M Hz.

The T/H stage 602 is able to sample an analog input signal on line 604 in the Qth Nyquist Zone, as defined with respect the M Hz output bandwidth. In one aspect, L is at least 105 gigahertz (GHz) and M is about 35 GHz. There are a number of conventions used in the art to define bandwidth, most of which are applicable to this discussion and for this reason the description of the M bandwidth may be defined in a number of different ways. In one aspect, the M bandwidth is a 3 dB bandwidth. In another aspect, the T/H stage 602 is fabricated with transistors (e.g., silicon/germanium (SiGe) transistors) having a cutoff frequency of greater than L Hz, and the quantizer stage 610 is fabricated with transistors (e.g., CMOS transistors) having a cutoff frequency greater than M Hz and less than L Hz. In other aspects, the bandwidths of signals in adjacent Nyquist zones may vary slightly due to variations of transistor gains across the frequency spectrum, and due to the frequency roll-off associated with some passive components and interconnects.

As noted above, the T/H stage 602 and quantizer stage 610 may be fabricated using different technologies. Complex high-speed communication systems often rely upon devices and materials that require different substrates and different processing technologies. Conventionally, this has prevented the integration of these devices into a single fabrication process flow. Thus, integration of these device technologies has occurred only at the chip-to-chip level, which introduces significant bandwidth and latency-related performance limitations on these systems, as well as increased size, weight, power, and packaging/assembly costs as compared to microsystems fully integrated on a single chip.

The Diverse Accessible Heterogeneous Integration (DAHI) program has developed transistor-scale heterogeneous integration processes to intimately combine advanced compound semiconductor (CS) devices, as well as other emerging materials and devices, with high-density silicon complementary metal-oxide-semiconductor (CMOS) technology, so as to establish a manufacturable, accessible foundry technology for the monolithic heterogeneous co-integration of diverse devices and complex silicon-enabled architectures on a common substrate platform. Thus, before the advent of DAHI, it was not practical to combine SiGe and CMOS dies on the same substrate. Some of the microsystem devices and materials that may be integrated include:

Silicon complementary metal-oxide-semiconductor (Si CMOS) for highly integrated analog and digital circuits;

Gallium Nitride (GaN) for high-power/high-voltage swing and low-noise amplifiers;

Gallium Arsenide (GaAs) and Indium Phosphide (InP) heterojunction bipolar transistors (HBT) and high-electron mobility transistors (HEMT) for high speed/high-dynamic-range/low-noise circuits;

Antimonide-based compound semiconductors for high-speed, low-power electronics;

Compound semiconductor optoelectronic devices for direct-bandgap photonic sources and detectors, as well as or silicon-based structures for modulators, waveguides, etc.; and, Microelectromechanical (MEMS) components for sensors, actuators and RF resonators.

In one optional variation as shown in phantom, a packaging interface 616 connects the T/H stage signal outputs on lines 608-1 through 608-n to the quantizer stage signal inputs on lines 612-1 through 612-n. Each packaging interface (the interface associated with each line) typically has a bandwidth less than the clock frequency. FIGS. 5A and 5B depict an example of a packaging interface.

Figure 7:
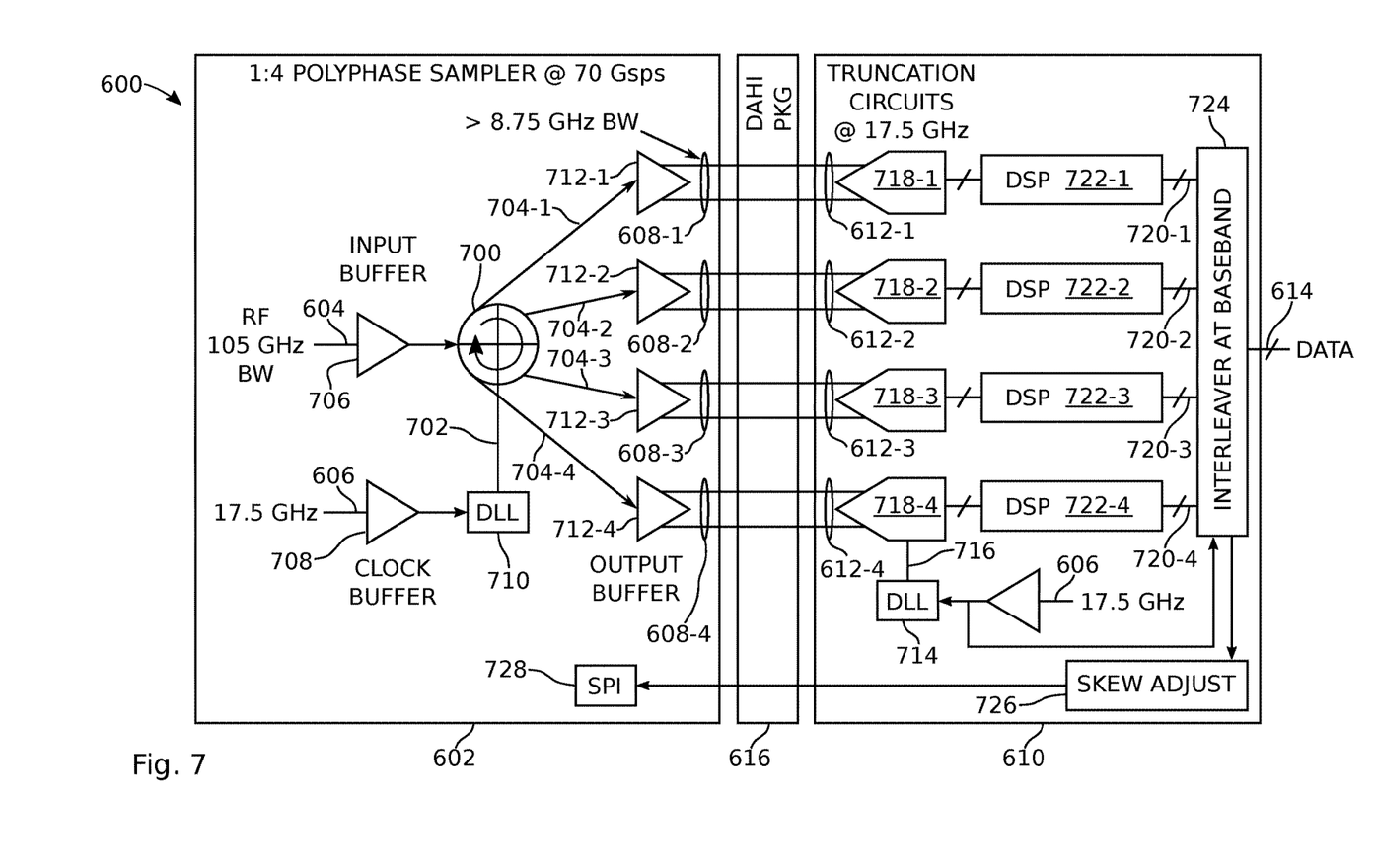
FIG. 7 is a schematic block diagram depicting the multi-zone ADC of FIG. 6 in greater detail.

FIG. 7 is a schematic block diagram depicting the multi-zone ADC of FIG. 6 in greater detail. The T/H stage 602 comprises a polyphase sampler 700, which may also be referred to as a deinterleaver, having a signal input to accept the analog input signal on line 604, and a phase input on line 702 to accept N phases of the clock signal. The polyphase sampler has outputs to supply N sampled signals on line 704-1 through 704-4, with each sampled signal being sampled at a corresponding clock signal phase. In this example, N=4. In one aspect, an input buffer 706 buffers the analog (radio frequency (RF)) signal on line 604. Optionally, a clock buffer 708 is used to buffer the clock signal supplied on line 606.

A delay-locked loop (DLL) 710 has an input to accept the clock signal (via the clock buffer 708), and an output on line 702 to supply the N phases of the clock frequency. N output buffers are shown, 712-1 through 712-4. Each output buffer has an input to accept a corresponding sampled signal on lines 704-1 through 704-4, and an output to supply a corresponding deinterleaved signal output on lines 608-1 through 608-4.

In this example, N=4, L is assumed to be at least 105 GHz, and P is 17.5 GHz. As a result, the DLL 710 supplies the N clock phases at an effective rate of 70 gigasamples per second (Gsps). The sampling rate of each interleaved path is 17.5 GHz, so according to Nyquist, the maximum bandwidth of each interleaved signal on lines 608-1 through 608-4 is 8.75 GHz, even if the buffers have a much greater device (e.g., SiGe) bandwidth potential.

The quantizer stage 610 comprises a delay-locked loop 714 having an input to accept the clock signal on line 606 and an output on line 716 to supply N phases of the clock frequency. In one aspect, a clock buffer 718 is used to buffer the clock signal on line 606. The quantizer stage 610 comprises N truncation circuits, 718-1 through 718-4. Each truncation circuit has a signal input to accept a corresponding T/H stage deinterleaved signal output, a phase input to accept a corresponding clock signal phase on line 716, and a signal output (lines 720-1 through 720-4) to supply a corresponding digital value. Since the truncation circuits convert an analog value to a digital value, they may be considered to be an ADC. However, the term "ADC" is not used to describe the truncation circuits as it may result in confusion with the description of the overall multi-zone ADC system 600. If realized in CMOS, at the time of this writing the maximum frequency of each clock phase delivered to a truncation circuit cannot be much greater than 17.5 GHz, see the discussion of FIGS. 5A and 5B, above. Although not explicitly shown in the figure, the bandwidth limitations associated with the introduction of signals to the CMOS gates likewise applies to the clock signals. As a result, the truncation circuits cannot practically, without violating Nyquist considerations, accept interleaved signals having a bandwidth greater than about 8.75 GHz.

The output of the truncation circuits on lines 720-1 through 720-4 may be expressed with one or more binary digits. Optionally, as shown, digital signal processors (DSPs) 722-1 through 722-4 may be used, for example, to filter the digital values or downconvert the values to more practical ranges. An interleaver 724 has a signal input to accept the N digital values from the truncation circuits 718-1 through 718-4, a clock input to accept the clock signal, and an output to supply the digital output on line 614.

The T/H stage of FIGS. 6 and 7 may also be described as a signal distribution system comprising an input sampling stage 700 able to sample an analog signal with a bandwidth of L Hertz and center frequency of greater than M Hz and less than L Hz, at a frequency of P Hertz. The polyphase sampler 700 may also be considered as a processing stage that distributes the sampled analog signal into N analog signals, each with a bandwidth of P/2 Hertz. An output stage (712-1 through 712-n) has N analog outputs on line 608-1 through 608-n, each with a bandwidth of P/2 Hertz, where L>M and M=N×(P/2).

As would be well understood in the art, the multi-zone ADC may include skew adjust circuitry 726 operating in the digital domain for making adjustments to clock frequency and the dynamic phase alignment serial peripheral interface bus (SPI) core 728.

Figure 8A:
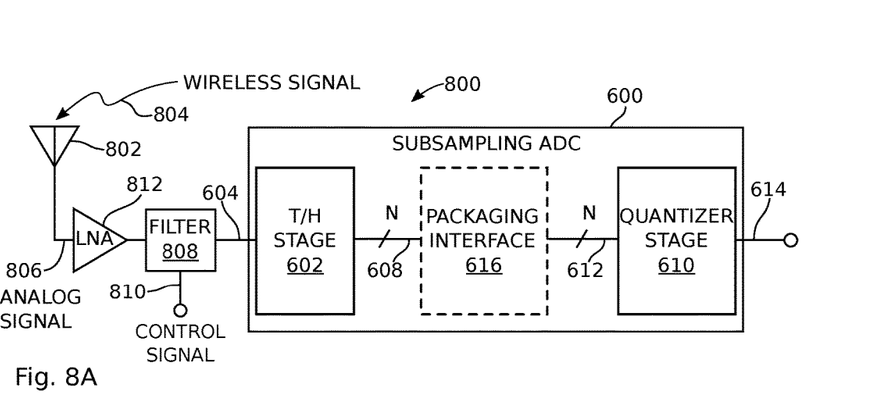
FIGS. 8A and 8B are schematic block diagrams depicting exemplary multi-zone receiver variations.

FIGS. 8A and 8B are schematic block diagrams depicting exemplary multi-zone receiver variations. In FIG. 8A the receiver 800 comprises an antenna 802 to accept a wireless input signal represented as reference designator 804 having a center frequency of less than or equal to L Hertz (Hz) and a signal output to supply an analog signal on line 806. A bandpass filter 808 has a signal input to accept the analog signal on line 806, and a signal output to supply a filtered signal having a bandwidth of M Hz. For simplicity and equivalence to FIGS. 6 and 7, the filtered signal is depicted as being carried on line 604. The receiver 800 also comprises the multi-zone ADC 600, with a T/H stage 602 and a quantizer stage 610. In one aspect, as shown, the multi-zone ADC 600 includes packaging interface 616. In the interest of brevity, a detailed discussion of these T/H and quantizer stage components is omitted here, see the explanation of FIGS. 6 and 7 above.

In one aspect, the bandpass filter 808 has an adjustable bandpass output and a control input to accept a control signal on line 810 for selecting the bandpass filter center frequency. In one variation, the bandpass filter 808 accepts a scanning control signal on line 810 for selectively monitoring frequency bandpass regions of the wireless input signal. In one aspect, the receiver includes a low noise amplifier (LNA) interposed between the antenna 802 and the bandpass filter 808.

Advantageously, the receiver is able to accept analog signals at high frequencies due to the SiGe input devices, efficiently convert the analog signals to digital information in a cost and energy efficient manner due to the CMOS devices, and recover the original information in interleaved analog signals sampled in higher Nyquist zones.

Figure 8B:
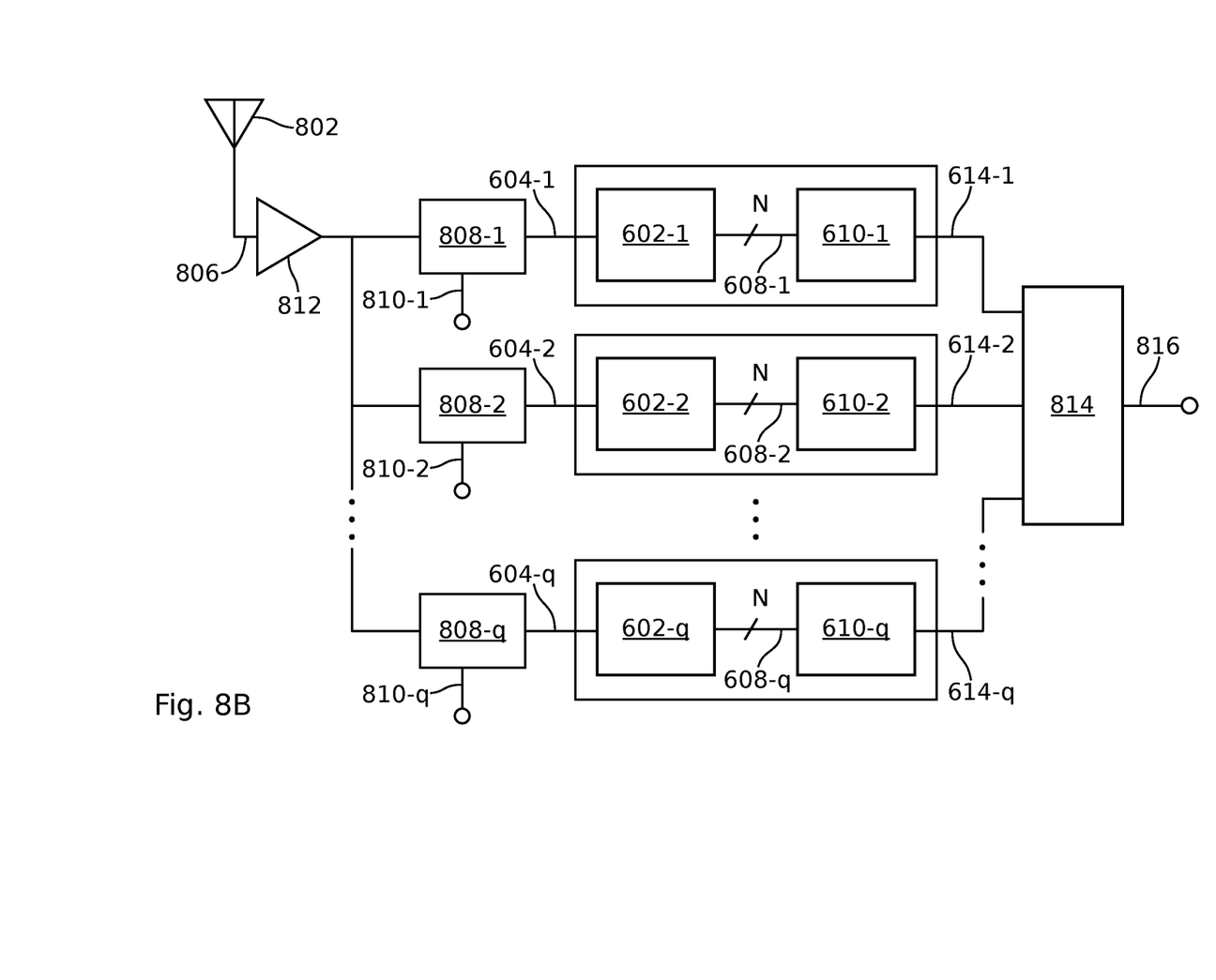

FIG. 8B depicts a plurality of multi-zone receivers operating in parallel. Bandpass filters 808-1 through 808-q are shown. Each bandpass filter has an antenna port to accept the analog input signal, typically amplified by LNA 812, and signal outputs 604-1 through 604-q to supply a corresponding filtered signal having a corresponding bandwidth. That is, each filtered signal may represent unique data, and each filtered signal may have a unique bandwidth. If, for example, each filtered signal bandwidth is M Hz, then L>M×Q Hz. Each of the bandpass filters also supplies a filtered signal in a unique frequency range. For example, bandpass filter 808-1 may supply signals in the range between 0 and 35 GHz, bandpass filter 808-2 may supply signals in the range between 35 and 70 GHz, and bandpass filter 808-q (e.g., q=3) may supply signals in the range between 70 and 105 GHz. Although not shown, switches may be interposed between the LNA and bandpass filters, so that not all of the bandpass filters receive input simultaneously. Alternatively but not shown, each multi-zone receiver may have its own dedicated LNA. As shown, the bandpass filters have control ports on lines 810-1 through 810-q for selecting the center frequency of each filter.

Shown are T/H stages 602-1 through 602-q. Each T/H stage has a signal input with a device bandwidth of at least L Hz to accept a corresponding filtered signal and deinterleaved signal outputs on line 608 with a corresponding combined bandwidth. That is, the combined bandwidth output by a T/H stage is equal to its accepted filtered signal bandwidth. In one aspect, each T/H stage uses a unique clock frequency, unique interleaving factor, or both. If the multi-zone receivers are permanently assigned to particular frequency ranges, then the lower frequency T/H stages need not necessarily have the wide (L Hz) input bandwidth of the higher frequency T/H stages.

Each quantizer stage 610-1 through 610-q has interleaved signal inputs connected to corresponding T/H stage signal outputs and an output to supply an independent digital output signal having the corresponding bandwidth on lines 614- through 614-q. Since each T/H stage receives a unique analog input signal, each of the quantizer stages may supply a unique digital output signal that may be referred to as independent, with the same bandwidth as the filtered signal received by its corresponding T/H stage.

In one optional variation as shown, a summer 814 is provided having an input connected to quantizer stages 610-1 through 610-q to receive the digital output signals on lines 614-1 through 614-q. The summer 814 has an output to supply an interleaved digital output word on line 816. The digital output signals may be used to increase the overall data bandwidth, or may provide redundancy for error checking. In this example it is assumed that each parallel multi-zone receiver uses the same clock (P) and the same deinterleaving factor (N), but this is not a requirement, as there may be differences in the clock frequencies and deinterleaving factors used in different multi-zone receivers.

Figure 9:
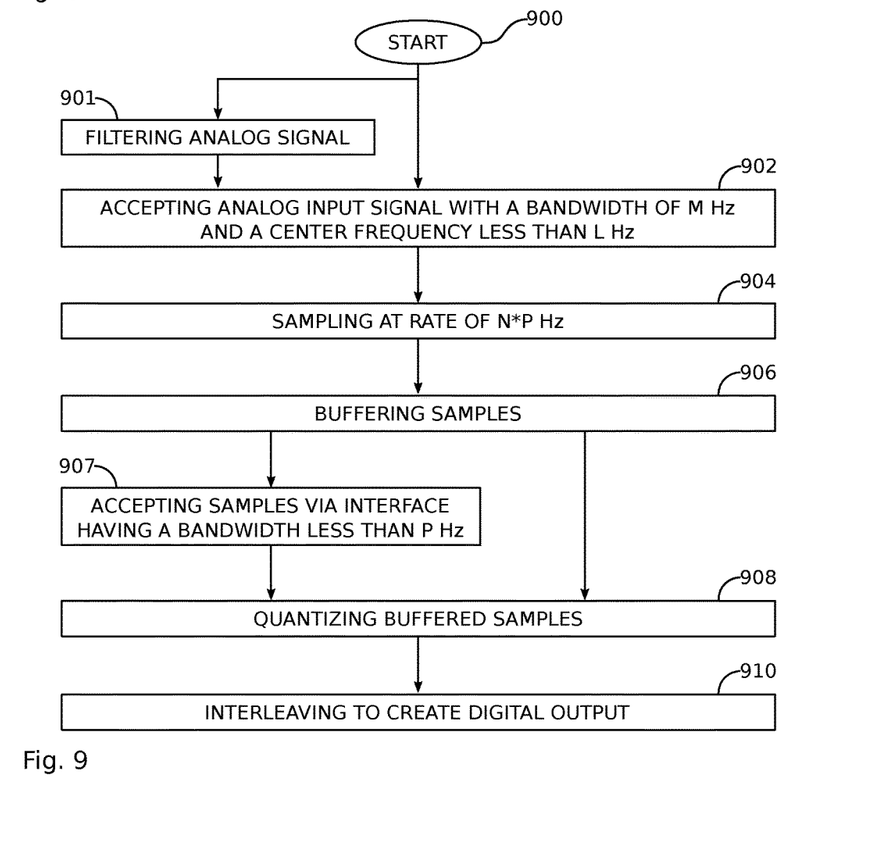
FIG. 9 is a flowchart illustrating a multi-zone analog-to-digital conversion method.

FIG. 9 is a flowchart illustrating a multi-zone analog-to-digital conversion method. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps, and the details of the method are supported by the explanations of FIGS. 6 through 8B, above. The method starts at Step 900.

Step 902 accepts an analog input signal having a bandwidth of M Hz and a center frequency of less than L Hz. Step 904 samples the analog input signal at a rate of N×P Hz, creating samples. Step 906 buffers the samples in N interleaved buffers, where N×(P/2)=M, where L>Q×M, and where Q is an integer greater than 1. In one aspect, L is at least 105 GHz and M is about 35 GHz. Step 908 quantizes each buffered sample at a rate P Hz, creating quantized samples. Step 910 interleaves the quantized samples at a rate of N×P Hz to create a digital output signal having a bandwidth of M Hz.

In one aspect, Step 904 samples the analog input signal in the Qth Nyquist Zone. In another aspect, Step 904 samples the analog input signal using transistors (e.g., SiGe transistors) having a cutoff frequency of greater than L Hz, and Step 908 quantizes the buffered samples using transistors (e.g., CMOS transistors) having a cutoff frequency greater than M Hz and less than L Hz.

In one aspect, prior to quantizing the buffered samples in Step 908, Step 907 accepts the buffered samples via a package interface having a bandwidth less than P Hz. In another aspect, prior to accepting the analog input signal in Step 902, Step 901 filters the analog input signal at a center frequency of less than L Hz, with a bandwidth of at least M Hz.

Figure 10:
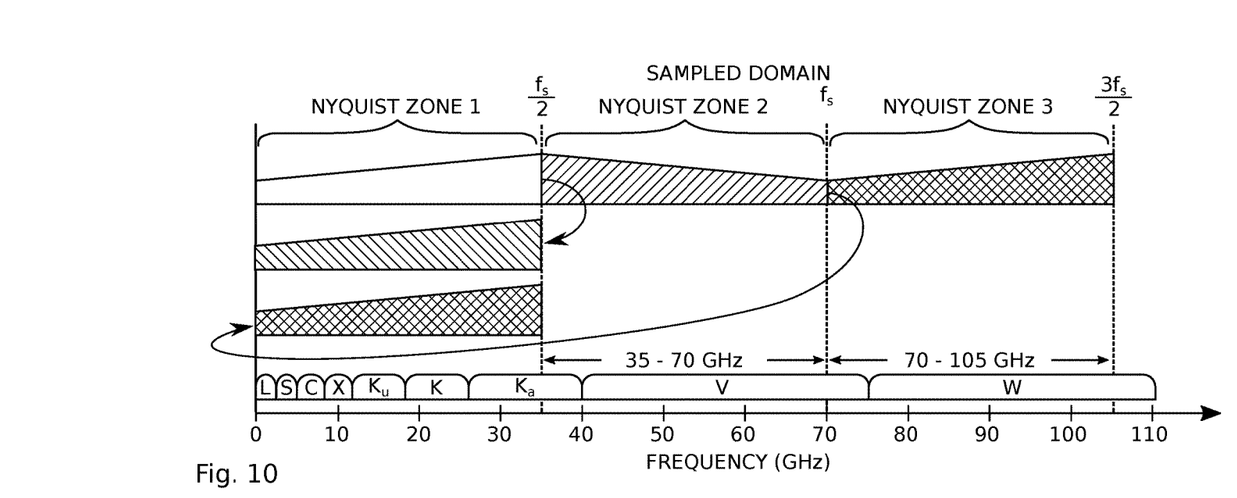
FIG. 10 is a diagram depicting an exemplary sampling domain.

FIG. 10 is a diagram, depicting an exemplary sampling domain. Using the exemplary values provided above (L=105 GHz, M=35 GHz, and P=17.5 GHz), the system described above in FIGS. 6-8B is able to sample signals in the first Nyquist zone (0 to 35 GHz), the second Nyquist zone (35 to 70 GHz), or the third Nyquist zone (70 to 105 GHz), without the need for a mixer as is required in conventional receivers.

Figure 11:
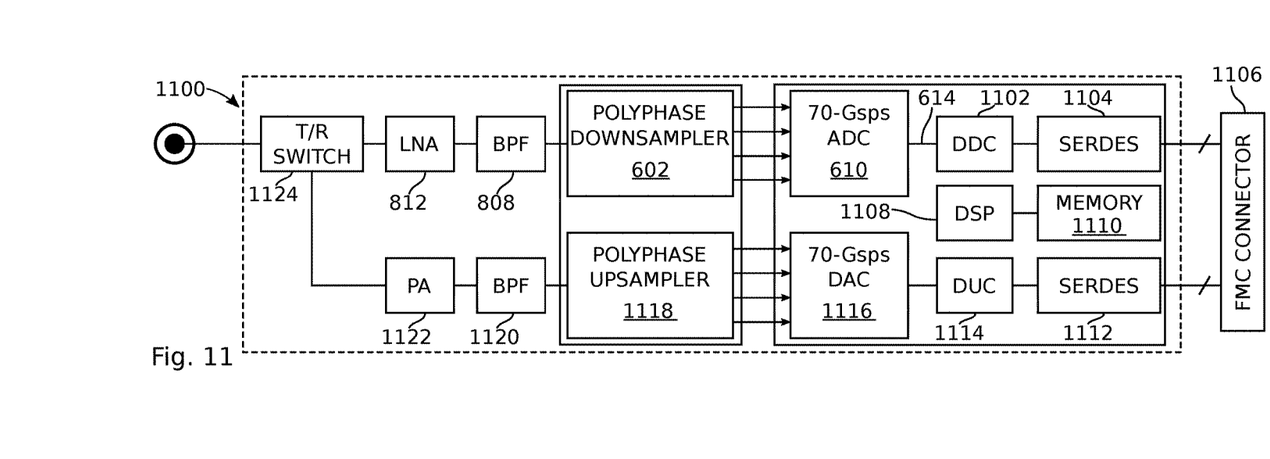
FIG. 11 is a schematic block diagram of a transceiver comprising the multi-zone receiver of FIG. 8.

FIG. 11 is a schematic block diagram of a transceiver 1100 comprising the multi-zone receiver of FIG. 8. Also shown is a digital downconverter (DDC) 1102, which may for example, be used to convert the digital output signal on line 614 to a lower frequency baseband signal. A serializer/deserializer (SERDES) 1104 may be used to convert the baseband digital between a serial and a parallel interface. A field programmable gate array (FPGA) mezzanine card (FMC) connector 1106 acts as the transceiver digital interface. DSP 1108, in conjunction with memory 1110, acts to control the DDC 1102 (and DUC).

The transceiver 1100 also includes a transmitter with a SERDES 1112, digital upconverter (DUC) 1114, digital-to-analog converter (DAC) 1116, polyphase upsampler 1118, bandpass filter (BPF) 1120, and power amplifier (PA) 1122. A transmit/receive (T/R) switch 1124 controls whether the transmitter or receiver is connected to the antenna (not shown). The DAC 1116 and polyphase upsampler 1118 operate on principles similar to those used in the T/H stage (polyphase downsampler) 602 and quantizer stage (ADC) 610) in an inverse application.

In the transmitter, it is impractical to move a signal at high enough bandwidth in a CMOS die to the limitations in metallization, as mention above in the description of FIGS. 5A and 5B. So, the signal transfer is made as efficiently as possible from the CMOS die to the SiGe device, and then the analog signal is "built" in the SiGe device. Note, it is also impractical to process the massive number of digital signals and complete the digital-to-analog conversion in the SiGe chip, as such circuitry would be relatively large in size and consume significant power. Thus, discrete analog charges are transferred from the CMOS domain to the SiGe domain, and the analog charge quantities are used to generate a continuous time signal. The continuous time signal is created with an "analog pulse shaper" by discharging the sample capacitors sequentially into the output stage. An example of an analog pulse shaper enabled as a current impulse (CI) DAC is provided is U.S. Pat. No. 9,178,528, which is incorporated herein by reference.

As a result, fundamental signals generated in the first Nyquist zone (e.g., 0 to 35 GHz) are faithfully reproduced as signal images at substantially the same power levels in the higher level Nyquist zones due to the ability of the large bandwidth SiGe devices to create impulse signals capable of generating lossless higher Nyquist zone signal images. The adjustable bandpass filter 1120 is used to select the frequency band (Nyquist zone) that is amplified by the power amplifier 1122. In contrast, a polyphase sampler built using a technology with lower cutoff frequency, lower bandwidth devices (e.g. CMOS), would produce lower power level signals in higher Nyquist zones that would additional include undesirable intermodulation products due to $\sin(x)/x$ attenuation. As would be understood by one with skill in the art, the SiGe switched capacitors are able to create narrow width pulses that enable an extremely wide bandwidth.

Figure 12A:
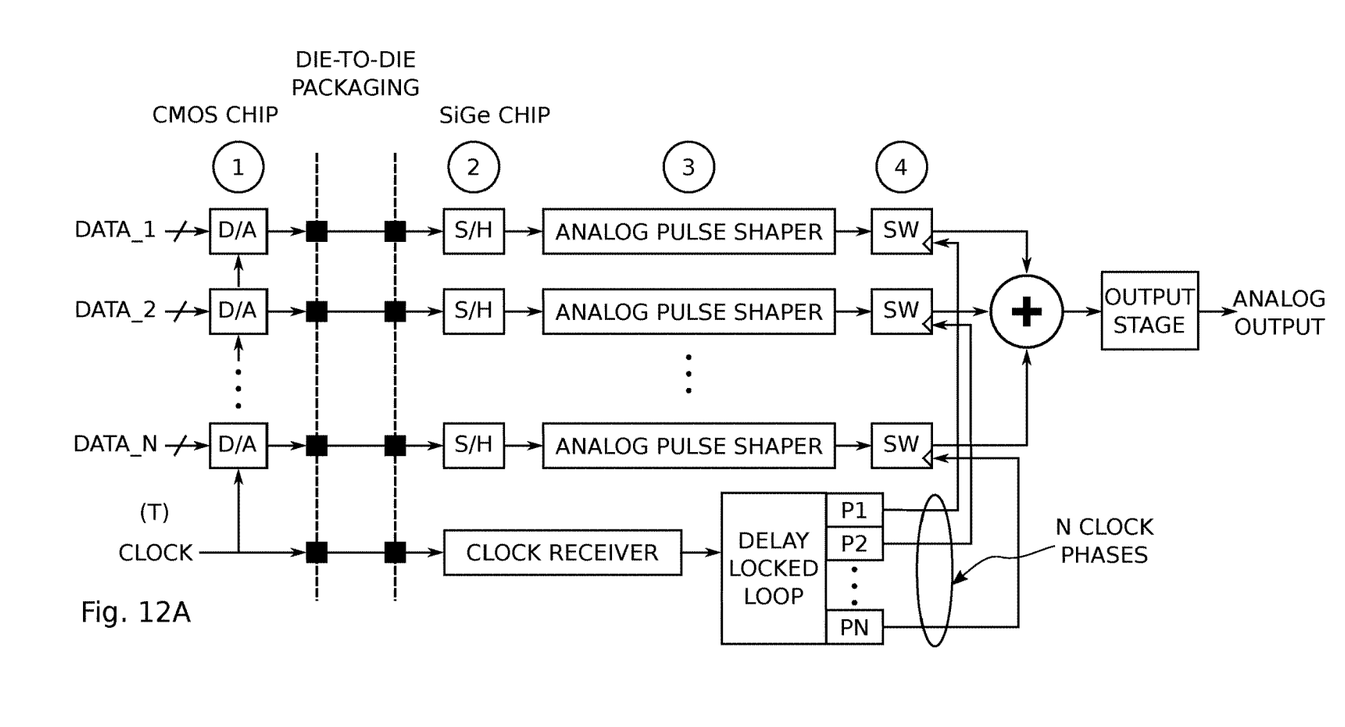
FIGS. 12A and 12B are schematic block diagrams of the multi-zone transmitter in greater detail.
Figure 12B:
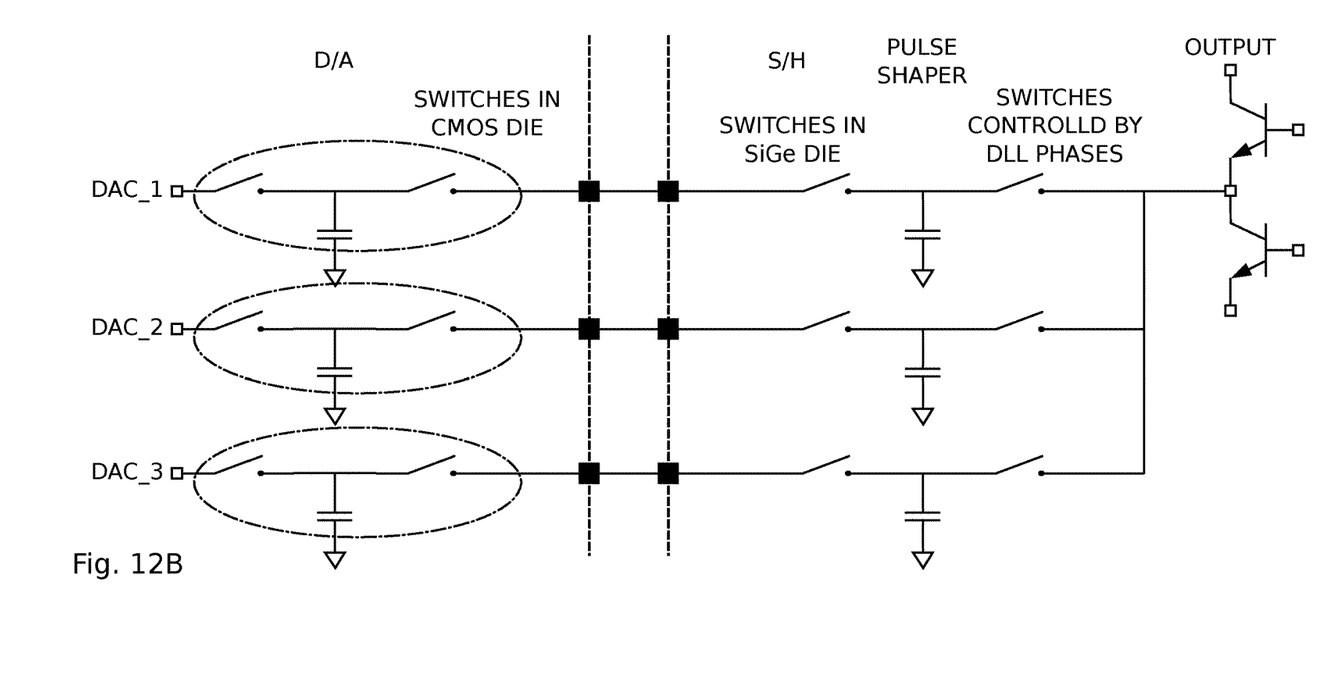

FIGS. 12A and 12B are schematic block diagrams of the multi-zone transmitter in greater detail. In Step one, signals are generated in the CMOS chip from a digital value, as a quantity of charge by means of a voltage stored on a capacitor. In Step two, the charge is transferred across that CMOS package boundary and saved in N parallel sample/hold (S/H) circuits. In Step three the signal (charge) is converted into a pulse shape with a width less than T/N, where T is the clock frequency. In Step four the signals are retimed for assembly as a sequence of pulses at an overall rate of N/T. FIG. 12B depicts the digital-to-analog (D/A), S/H, and pulse shaper circuits in greater detail.

Figure 13:
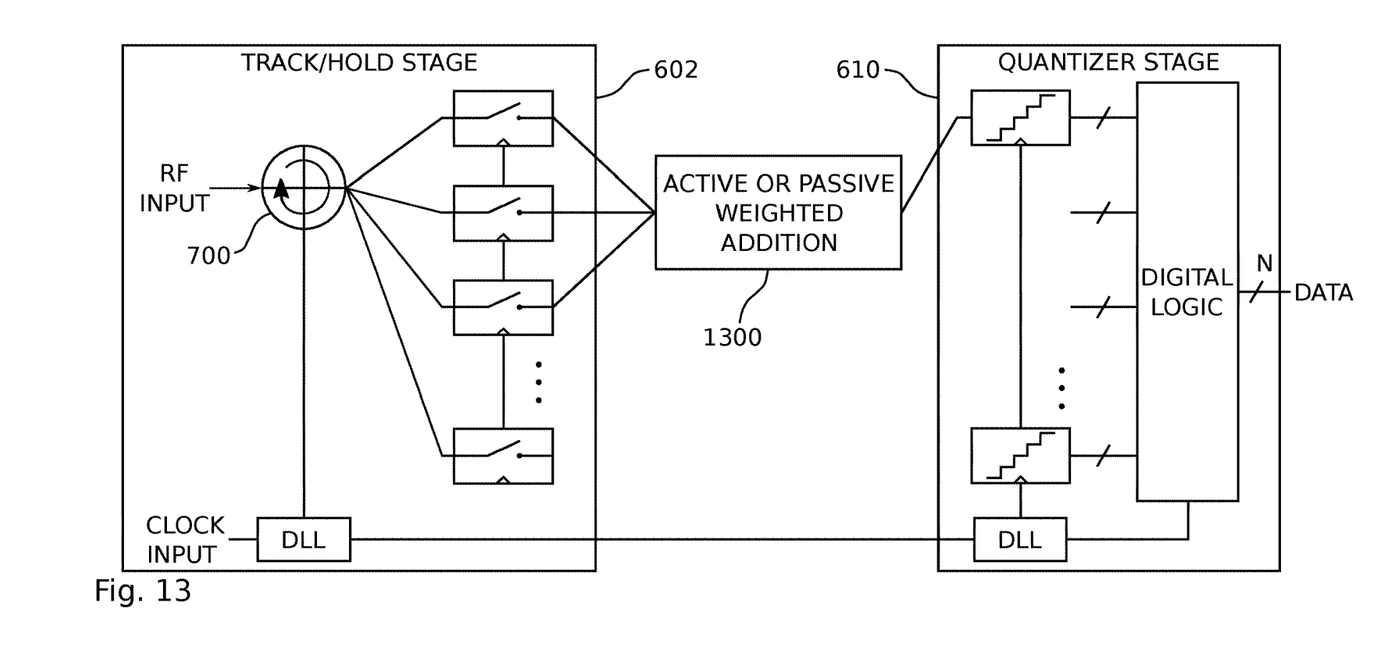
FIG. 13 is a schematic block diagram depicting the multi-zone ADC repurposed as an analog finite impulse response (FIR) filter.

FIG. 13 is a schematic block diagram depicting the multi-zone ADC repurposed as an analog finite impulse response (FIR) filter. For cases where the full bandwidth capture need not be captured, the T/H stage 602 (polyphase sampler 700) aggregates signals ahead of quantization in the quantizer stage 610, to minimize the quantization rate. As shown, a subset the deinterleaved T/H stage outputs may be weighted either actively or passively by device 1300.

A system and method have been provided for a multi-zone ADC and receiver. Examples of particular structures and device types have been presented to illustrate the invention. However, the invention is not limited to merely these examples. Other variations and embodiments of the invention will occur to those skilled in the art.

We claim:

1. A multi-zone analog-to-digital converter (ADC) comprising:
    a track-and-hold (T/H) stage having a signal input with a bandwidth of L Hertz (Hz) to accept an analog input signal, a clock input to accept a clock signal with a clock frequency of P Hz, and N deinterleaved signal outputs with a combined bandwidth of M Hz, where N×(P/2)=M, L>Q×M, and Q is an integer greater than 1; and,
    a quantizer stage having N interleaved signal inputs connected to corresponding T/H stage signal outputs, a clock input to accept the clock signal, and an output to supply a digital output signal having a bandwidth of M Hz.

2. The multi-zone ADC of claim 1 wherein the T/H stage samples an analog input signal in the Qth Nyquist Zone.

3. The multi-zone ADC of claim 1 wherein L is at least 105 gigahertz (GHz) and M is about 35 GHz.

4. The multi-zone ADC of claim 1 wherein the T/H stage is fabricated with transistors having a cutoff frequency of greater than L Hz; and,
    wherein the quantizer stage is fabricated with transistors having a cutoff frequency greater than M Hz and less than L Hz.

5. The multi-zone ADC of claim 4 wherein the T/H stage is fabricated with silicon/germanium (SiGe) transistors; and,
    wherein the quantizer stage is fabricated with CMOS transistors.

6. The multi-zone ADC of claim 1 wherein the quantizer stage further comprises:
    N packaging interfaces, each packing interface connecting a T/H stage signal output to a corresponding quantizer stage signal input, and each packaging interface having a bandwidth less than the clock frequency.

7. The multi-zone ADC of claim 1 wherein the T/H stage comprises:
    a polyphase sampler having a signal input to accept the analog input signal, a phase input to accept N phases of the clock signal, and outputs to supply N sampled signals, with each sampled signal being sampled at a corresponding clock signal phase;
    a delay-locked loop having an input to accept the clock signal, and an output to supply the N phases of the clock frequency;
    N output buffers, each output buffer having an input to accept a corresponding sampled signal and an output to supply a corresponding deinterleaved signal output;
    wherein the quantizer stage comprises:
        a delay-locked loop having an input to accept the clock signal and an output to supply N phases of the clock frequency;
        N truncation circuits, each truncation circuit having a signal input to accept a corresponding T/H stage deinterleaved signal output, a phase input to accept a corresponding clock signal phase, and a signal output to supply a corresponding digital value; and,
        an interleaver having a signal input to accept the N digital values from the truncation circuits, a clock input to accept the clock signal, and an output to supply the digital output.

8. A multi-zone receiver comprising:
    a bandpass filter having an antenna port to accept an analog input signal having a center frequency less than or equal to L Hertz (Hz), and a signal output to supply a filtered signal having a bandwidth of at least M Hz;
    a track-and-hold (T/H) stage having a signal input with a bandwidth of at least L Hz to accept the filtered signal, a clock input to accept a clock signal with a clock frequency of P Hz, and N deinterleaved signal outputs with a combined bandwidth of M Hz, where N×(P/2)= M, L>Q×M, and Q is an integer greater than 1; and,
    a quantizer stage having N interleaved signal inputs connected to corresponding T/H stage signal outputs, a clock input to accept the clock signal, and an output to supply a digital output signal having a bandwidth of M Hz.

9. The multi-zone receiver of claim 8 wherein the T/H stage samples a filtered input signal in the Qth Nyquist Zone.

10. The multi-zone receiver of claim 8 wherein L is at least 105 gigahertz (GHz) and M is about 35 GHz.

11. The multi-zone receiver of claim 8 wherein the T/H stage is fabricated with transistors having a cutoff frequency of greater than L Hz; and,
wherein the quantizer stage is fabricated with transistors having a cutoff frequency greater than M Hz and less than L Hz.

12. The multi-zone receiver of claim 11 wherein the T/H stage is fabricated with silicon/germanium (SiGe) transistors; and,
wherein the quantizer stage is fabricated with CMOS transistors.

13. The multi-zone receiver of claim 8 wherein the quantizer stage further comprises:
N packaging interfaces, each packaging interface connecting a T/H stage signal output to a corresponding quantizer stage signal input, and each packaging interface having a bandwidth less than the clock frequency.

14. The multi-zone receiver of claim 8 wherein the T/H stage comprises:
a polyphase sampler having a signal input to accept the analog input signal, a phase input to accept N phases of the clock signal, and an output to supply N sampled signals, with each sampled signal being sampled at a corresponding clock signal phase;
a delay-locked loop having an input to accept the clock signal and an output to supply the N phases of the clock frequency;
N output buffers, each output buffer having an input to accept a corresponding sampled signal and an output to supply a corresponding deinterleaved signal output;
wherein the quantizer stage comprises:
a delay-locked loop having an input to accept the clock signal and an output to supply the N phases of the clock frequency;
N truncation circuits, each truncation circuit having a signal input to accept a corresponding T/H stage deinterleaved signal output, a phase input to accept a corresponding clock signal phase, and a signal output to supply a corresponding digital value; and,
an interleaver having a signal input to accept the N digital values from the truncation circuits, a clock input to accept the clock signal, and an output to supply the digital output signal.

15. The multi-zone receiver of claim 8 wherein the bandpass filter has an adjustable bandpass output and a control input to accept a control signal for selecting the bandpass filter center frequency.

16. The multi-zone receiver of claim 15 wherein the bandpass filter accepts a scanning control signal for selectively monitoring frequency bandpass regions of the wireless input signal.

17. The multi-zone receiver of claim 8 further comprising:
(Z-1) additional bandpass filters, each additional bandpass filter having an antenna port to accept the analog input signal and a signal output to supply a corresponding filtered signal having a corresponding bandwidth, where each of the Z bandpass filters supplies a filtered signal in a unique frequency range;
(Z-1) additional T/H stages, each additional T/H stage having a signal input with a bandwidth of at least L Hz to accept a corresponding filtered signal and deinterleaved signal outputs with a corresponding combined bandwidth; and,
(Z-1) additional quantizer stages, each additional quantizer stage having interleaved signal inputs connected to corresponding T/H stage signal outputs and an output to supply a corresponding digital output signal having the corresponding bandwidth, where each of the Z quantizer stages supplies an independent digital output signal.

18. The multi-zone receiver of claim 17 further comprising:
a summer having an input connected to the Z quantizer stages to receive the Z independent digital output signals, and an output to supply an interleaved digital output word.

19. A multi-zone analog-to-digital conversion method comprising:
a track-and-hold (T/H) stage accepting an analog input signal having a bandwidth of M Hertz (Hz) and a center frequency of less than L Hz;
the T/H stage sampling the analog input signal at a rate of N×P Hz, creating samples;
the T/H stage buffering the samples in N deinterleaved buffers, where N×(P/2)=M, where L>Q×M, and where Q is an integer greater than 1;
a quantizer stage quantizing each buffered sample at a rate P Hz, creating quantized samples; and,
the quantizer interleaving the quantized samples at a rate of N×P Hz to create a digital output signal having a bandwidth of M Hz.

20. The method of claim 19 wherein sampling the analog input signal at a rate of N×P Hz includes sampling the analog input signal in the Qth Nyquist Zone.

21. The method of claim 19 wherein L is at least 105 gigahertz (GHz) and M is about 35 GHz.

22. The method of claim 19 wherein sampling the analog input signal at a rate of N×P Hz includes sampling the analog input signal using transistors having a cutoff frequency of greater than L Hz; and,
wherein quantizing each buffered sample includes quantizing the buffered samples using transistors having a cutoff frequency greater than M Hz and less than L Hz.

23. The method of claim 22 wherein sampling the analog input signal includes sampling the analog input signal using silicon/germanium (SiGe) transistors; and,
wherein quantizing the buffered samples includes quantizing the buffered samples using CMOS transistors.

24. The method of claim 19 further comprising:
prior to quantizing the buffered samples, the quantizer stage accepting the buffered samples via a package interface having a bandwidth less than P Hz.

25. The method of claim 19 further comprising:
prior to accepting the analog input signal, a bandpass filter filtering the analog input signal at a center frequency of less than L Hz, with a bandwidth of at least M Hz.

26. A signal distribution system comprising:
an input sampling stage able to sample an analog signal with a bandwidth of M Hertz and a center frequency of greater than M Hertz and less than L Hertz, at a frequency of P Hertz;
a processing stage where the sampled analog signal is distributed into N analog signals, each with a bandwidth of (P/2) Hertz; and,
an output stage with N analog outputs, each with a bandwidth of (P/2) Hertz, where L≥M=N×(P/2).

* * * * *